US012654277B2

(12) United States Patent
Miyazaki

(10) Patent No.: US 12,654,277 B2
(45) Date of Patent: Jun. 16, 2026

(54) PROCESSING CONDITION SETTING APPARATUS, PROCESSING CONDITION SETTING METHOD, AND WAFER PRODUCTION SYSTEM

(71) Applicant: SUMCO Corporation, Tokyo (JP)

(72) Inventor: Yuji Miyazaki, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 375 days.

(21) Appl. No.: 18/546,797

(22) PCT Filed: Jan. 28, 2022

(86) PCT No.: PCT/JP2022/003436
§ 371 (c)(1),
(2) Date: Aug. 17, 2023

(87) PCT Pub. No.: WO2022/176576
PCT Pub. Date: Aug. 25, 2022

(65) Prior Publication Data
US 2024/0123566 A1 Apr. 18, 2024

(30) Foreign Application Priority Data
Feb. 22, 2021 (JP) ................................. 2021-026648

(51) Int. Cl.
*B24B 37/005* (2012.01)
*G05B 19/418* (2006.01)
*H10P 52/00* (2026.01)

(52) U.S. Cl.
CPC ...... *B24B 37/005* (2013.01); *G05B 19/41875* (2013.01); *H10P 52/00* (2026.01);
(Continued)

(58) Field of Classification Search
CPC .................. H01L 21/304; H01L 22/12; G05B 2219/45232; G05B 19/41875;
(Continued)

(56) References Cited

U.S. PATENT DOCUMENTS 7,937,234 B2 * 5/2011 St. Pierre ................ H01L 22/20
702/33
10,481,592 B2 * 11/2019 Good .................. G05B 19/4188
(Continued)

FOREIGN PATENT DOCUMENTS

JP 2002-154053 5/2002
JP 2003-85526 3/2003
(Continued)

OTHER PUBLICATIONS

Office Action issued in Corresponding KR Patent Application No. 10-2023-7025640, dated Jul. 12, 2024, along with an English translation thereof.
(Continued)

*Primary Examiner* — Vincent H Tran
(74) *Attorney, Agent, or Firm* — Greenblum & Bernstein, P.L.C.

(57) ABSTRACT

A processing condition setting apparatus includes a controller that selects a parameter set to be applied to the wafer processing apparatus from a plurality of parameter sets. The controller estimates, for each of the parameter sets, the post-processing characteristics of the wafer to be processed, based on the pre-processing characteristics of the wafer to be processed and the processing data, assuming that the wafer to be processed has been processed by applying each of the parameter sets. The controller calculates two or more indicators for each of the post-processing characteristics and obtains constraints on the indicators. The controller selects a parameter set, which is to be applied to the wafer pro-
(Continued)

cessing apparatus when processing the wafer to be processed, from among the conformed parameter sets in which the indicators satisfy the constraints.

13 Claims, 10 Drawing Sheets

(52) U.S. Cl.
CPC .............. *G05B 2219/45031* (2013.01); *G05B 2219/45232* (2013.01)

(58) Field of Classification Search
CPC ........... G05B 2219/32201; G05B 2219/45031; B24B 37/005
See application file for complete search history.

(56) References Cited

U.S. PATENT DOCUMENTS

| | | | |
|---|---|---|---|
| 2002/0197745 | A1 | 12/2002 | Shanmugasudram et al. |
| 2004/0203321 | A1 | 10/2004 | Tsuchiyama et al. |
| 2005/0170749 | A1* | 8/2005 | Kann ..................... B24B 37/005 451/41 |
| 2005/0245169 | A1 | 11/2005 | Morisawa et al. |
| 2009/0269861 | A1* | 10/2009 | Kurosawa ............... H01L 22/20 156/345.24 |
| 2012/0154070 | A1* | 6/2012 | Camp, Jr. ................ H03H 7/38 333/32 |
| 2013/0011939 | A1* | 1/2013 | Chan ....................... H01L 22/20 257/E21.529 |
| 2016/0031062 | A1 | 2/2016 | Han et al. |
| 2019/0295827 | A1 | 9/2019 | Ohmori et al. |
| 2021/0174215 | A1* | 6/2021 | Chan ..................... G06F 16/282 |

FOREIGN PATENT DOCUMENTS

| | | |
|---|---|---|
| JP | 2005-520317 | 7/2005 |
| JP | 2005-317864 | 11/2005 |
| JP | 2007-220842 | 8/2007 |
| JP | 2009-65213 | 3/2009 |
| JP | 2009-267159 | 11/2009 |
| JP | 2012-228745 | 11/2012 |
| JP | 2016-32862 | 3/2016 |
| JP | 2019-165123 | 9/2019 |
| TW | I277149 | 3/2007 |
| WO | 2007/094443 | 8/2007 |

OTHER PUBLICATIONS

International Search Report issued in International Patent Application No. PCT/JP2022/003436, dated Apr. 12, 2022, along with an English translation thereof.

Office Action issued in Corresponding Taiwanese Patent Appl. No. 111106171, dated Dec. 26, 2022, along with an English translation thereof.

International Preliminary Report on Patentability issued in International Patent Application No. PCT/JP2022/003436, dated Aug. 22, 2023, along with an English translation thereof.

Office Action issued in Corresponding JP Patent Application No. 2021-026648, dated Apr. 23, 2024, along with an English translation thereof.

* cited by examiner

PROCESSING CONDITION SETTING APPARATUS, PROCESSING CONDITION SETTING METHOD, AND WAFER PRODUCTION SYSTEM

TECHNICAL FIELD

This disclosure relates to a processing condition setting apparatus and a processing condition setting method for setting processing conditions in a wafer processing apparatus, and a wafer production system including the wafer processing apparatus.

BACKGROUND

The conventional control methods to optimize the polishing time in a semiconductor wafer polishing apparatus are known (see, for example, PTL 1 et al.).

CITATION LIST

Patent Literature

PTL 1: 2002-154053 A

SUMMARY

Technical Problem

The quality of wafers processed by the wafer processing apparatus can be represented by multiple indicators. The wafer processing apparatus needs to be controlled so that the quality of wafers represented by each indicator is improved.

Therefore, the purpose of this disclosure is to propose a processing condition setting apparatus, a processing condition setting method, and a wafer production system that can improve the quality of wafers.

Solution to Problem

An embodiment of the present disclosure for solving the above problem is as follows:

[1]
A processing condition setting apparatus comprising a controller that selects a parameter set to be applied to a wafer processing apparatus from a plurality of parameter sets,
each of the parameter sets includes a combination of setting values set for each of a plurality of setting items that specify processing operation of the wafer processing apparatus,
each of the setting items is applied in one processing step performed by the wafer processing apparatus,
the controller,
before the wafer processing apparatus processes a wafer to be processed:
obtains changes in wafer characteristics before and after processing when a wafer is processed by applying each of the parameter sets, as the processing data for each of the parameter sets;
obtains pre-processing characteristics of the wafer to be processed;
estimates, for each of the parameter sets, post-processing characteristics of the wafer to be processed, based on the pre-processing characteristics of the wafer to be processed and the processing data, assuming that the wafer to be processed has been processed by applying each of the parameter sets, and calculates two or more indicators for each of the post-processing characteristics;
obtains constraints on the indicators; and
selects a parameter set, which is to be applied to the wafer processing apparatus when processing the wafer to be processed, from among conformed parameter sets in which the indicators satisfy the constraints.

[2]
The processing condition setting apparatus according to above [1], wherein the controller classifies the conformed parameter sets into parameter groups; selects one parameter group from the parameter groups as a selected group; and selects a parameter set, which is to be applied when processing the wafer to be processed, from the conformed parameter sets classified in the selected group, as a processing parameter set.

[3]
The processing condition setting apparatus according to above [2], wherein
the controller,
further obtains target values for the indicators; and
sets priority for each of the two or more indicators and selects the processing parameter set so that the indicator with the higher priority is closer to the target values.

[4]
The processing condition setting apparatus according to above [2] or [3], wherein
the controller,
maps each of the parameter sets to a grid point defined in a multidimensional vector space with each of the setting items as a basis;
classifies the grid points that correspond to the conformed parameter sets and are adjacent to each other in the multidimensional vector space into the same grid point group; and
classifies the parameter sets that correspond to the grid points classified in the grid point group into the same parameter group.

[5]
The processing condition setting apparatus according to above [3], wherein
the controller,
expands the range of constraints for indicators with lower priority when there is no parameter set for which the indicators satisfy the constraints, so that to extract a parameter set for which the indicators satisfy the constraints.

[6]
The processing condition setting apparatus according to above [5], wherein the controller selects a predetermined initial parameter set or a parameter set of the previous processing as the parameter set to be applied when processing the wafer to be processed, when there is no parameter set for which the indicators satisfy the constraints even after expanding the range of the constraints.

[7]
The processing condition setting apparatus according to any one of above [2] to [6], wherein the controller selects one parameter group that has the largest number of parameter sets classified into the parameter groups.

3

4

[8]

The processing condition setting apparatus according to any one of above [2] to [6], wherein the controller selects one parameter group based on statistics of the indicators of the post-processing characteristics estimated for the parameter sets classified into the parameter groups.

[9]

The processing condition setting apparatus according to above [8], wherein the controller, sets a priority for each of the two or more indicators; and selects a parameter group for which the average value of the indicators with the high priority of the post-processing characteristics is closest to target values of the constraints.

[10]

The processing condition setting apparatus according to any one of above [1] to [9], wherein the controller acquires, as the processing data, the changes in wafer characteristics before and after processing assuming the setting values of each of two or more of the setting items in one or more of the processing steps, or the changes in wafer characteristics before and after processing assuming the setting values of each of one or more of the setting items in two or more of the processing steps.

[11]

A processing condition setting method for selecting a parameter set to be applied to a wafer processing apparatus from among a plurality of parameter sets, wherein each of the parameter sets includes a combination of setting values set for each of a plurality of setting items that specify the processing operation of the wafer processing apparatus, each of the setting items is applied in one processing step performed by the wafer processing apparatus, the processing condition setting method includes the following steps:

obtaining changes in wafer characteristics before and after processing when a wafer is processed by applying each of the parameter sets, as the processing data for each of the parameter sets, before the wafer processing apparatus processes a wafer to be processed;

obtaining pre-processing characteristics of the wafer to be processed;

estimating, for each of the parameter sets, the post-processing characteristics of the wafer to be processed, based on the pre-processing characteristics of the wafer to be processed and the processing data, assuming that the wafer to be processed has been processed by applying each of the parameter sets, and calculating two or more indicators for each of the post-processing characteristics;

obtaining constraints on the indicators; and selecting a parameter set, which is to be applied to the wafer processing apparatus when processing the wafer to be processed, from among conformed parameter sets in which the indicators satisfy the constraints.

[12]

A wafer production system, comprising the processing condition setting apparatus of any one of claims 1 to 10, and the wafer processing apparatus.

Advantageous Effect

According to the processing condition setting apparatus, the processing condition setting method, and the wafer production system of the present disclosure, the quality of wafers can be improved.

DETAILED DESCRIPTION

Figure 1:
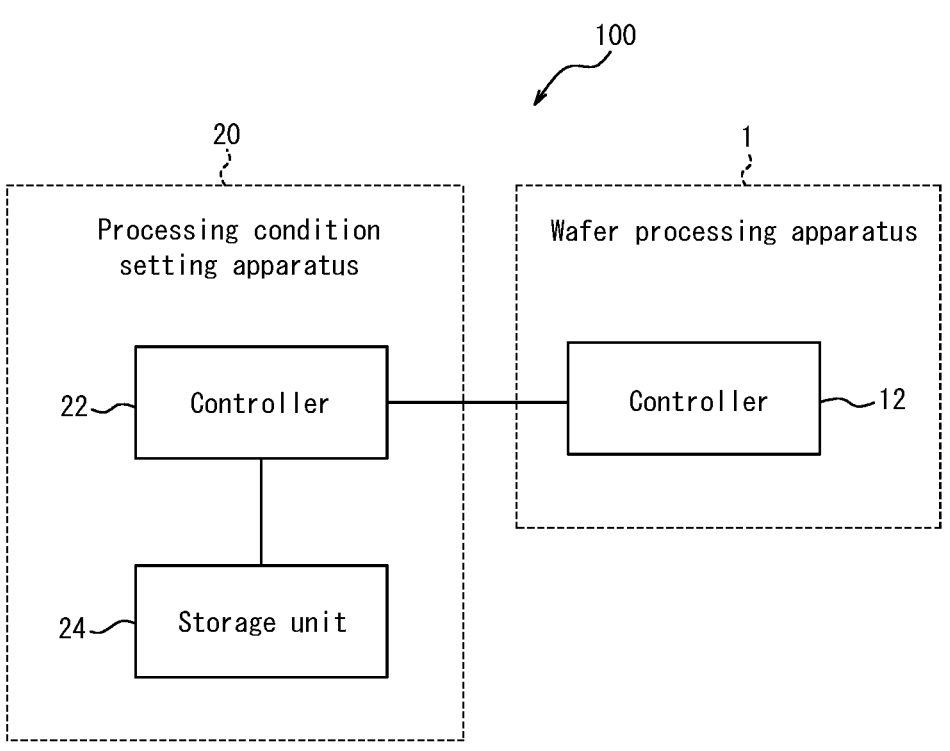
FIG. 1 is a block diagram illustrating an example configuration of a wafer production system in accordance with one embodiment of the present disclosure.

Hereinafter, a wafer production system 100 according to one embodiment of the present disclosure will be described with reference to the drawings. As shown in FIG. 1, the wafer production system 100 comprises a wafer processing apparatus 1 and a processing condition setting apparatus 20. The processing condition setting apparatus 20 sets the processing conditions for the wafer processing apparatus 1.

(Configuration Example of Wafer Processing Apparatus 1)

In this embodiment, the wafer processing apparatus 1 is described as a double-sided wafer polishing apparatus. The wafer processing apparatus 1 is not limited to a polishing apparatus, but may be other processing apparatus such as a wire saw apparatus.

Figures 2, 3:
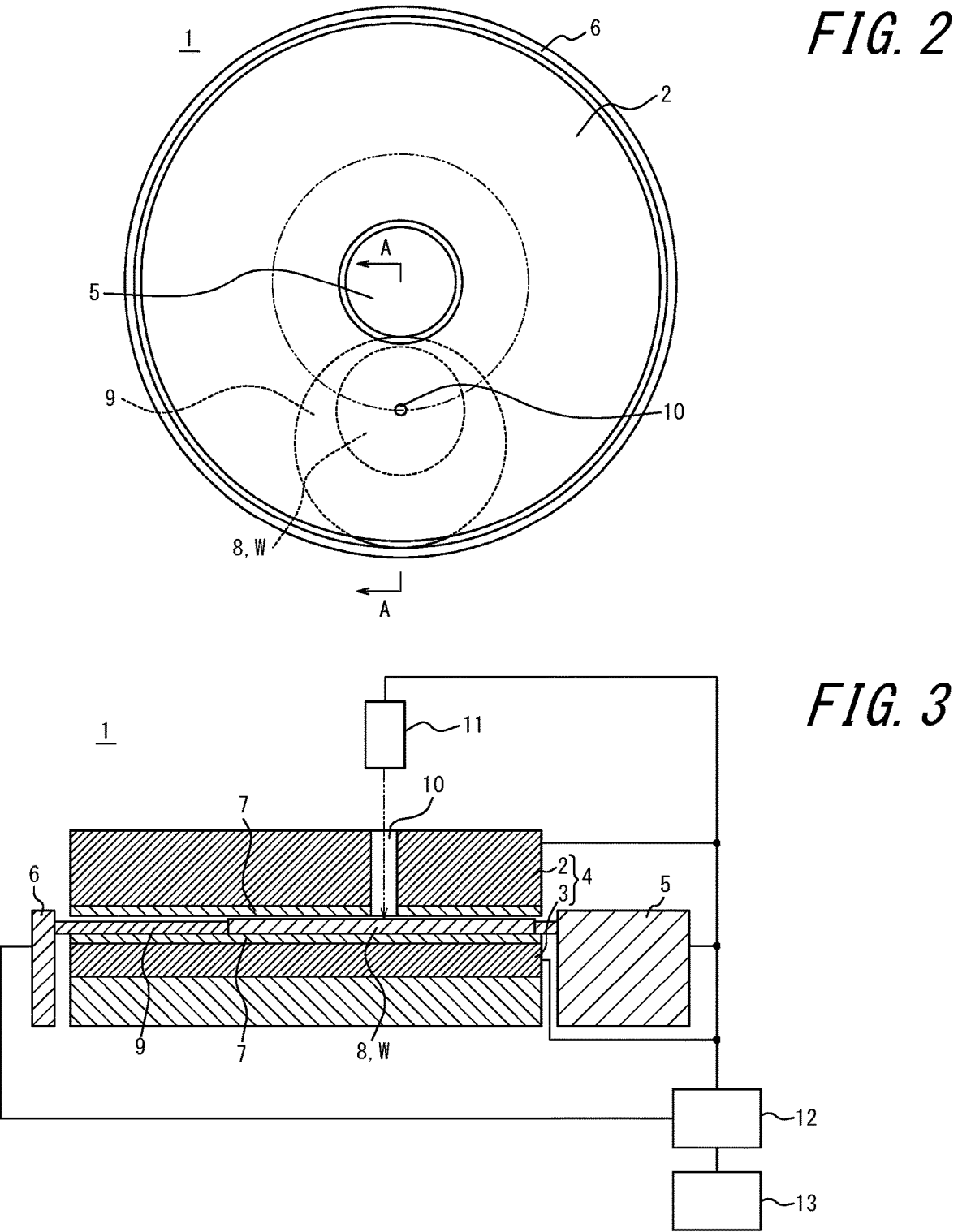
FIG. 2 is a top view of a double-sided wafer polishing apparatus as a wafer processing apparatus in accordance with one embodiment of the present disclosure.
FIG. 3 is a cross sectional view along the line A-A in FIG. 2.

FIG. 2 is a top view of the wafer processing apparatus 1 in accordance with one embodiment of the present disclosure. FIG. 3 is a cross sectional view along the line A-A in FIG. 2. As shown in FIGS. 2 and 3, the wafer processing apparatus 1 comprises a rotating plate 4 with an upper plate 2 and a lower plate 3 opposed thereto, a sun gear 5 provided at the center of rotation of the rotating plate 4, and an internal gear 6 circularly provided around the periphery of the rotating plate 4. As shown in FIG. 3, polishing pads 7 are applied to the opposite surfaces of the upper and lower rotating plates 4, i.e., the bottom surface which is the polishing surface of the upper plate 2 and the top surface which is the polishing surface of the lower plate 3, respectively.

The wafer processing apparatus 1 is provided between the upper plate 2 and the lower plate 3 and comprises a plurality of carrier plates 9 with one or more openings 8 that hold a work W (wafer) to be processed. In FIG. 2, only one of the multiple carrier plates 9 is shown. The number of openings 8 may be one or more, and may be three, for example. The work W may be held in the openings 8.

Assume that the wafer processing apparatus 1 is a planetary gearing double-side polishing apparatus which can rotate the sun gear 5 and the internal gear 6 to cause planetary motion involving the orbital motion and the rotational motion of the carrier plate 9. In the wafer processing apparatus 1, while supplying a polishing slurry, the carrier plate 9 is made to perform planetary motion and at the same time, the upper plate 2 and the lower plate 3 are relatively rotated with respect to the carrier plate 9, thereby making the polishing pads 7 attached to the upper and lower rotating plates 4 rubbed against the surfaces of the work held in the openings 8 in the carrier plate 9; thus, both surfaces of the work can be polished simultaneously.

In this wafer processing apparatus 1, the upper plate 2 has one or more apertures 10 that penetrate from the top surface to the bottom surface, which is the polishing surface, of the upper plate 2. That is, the apertures 10 are located on the upper plate 2. One of the apertures 10 is located at a position passing near the center of the work W. The number of apertures 10 is not limited to one, but may be two or more. The apertures 10 may be provided not only in the upper plate 2 but also in the lower plate 3. The one or more apertures 10 may be provided in at least one of the upper plate 2 and the lower plate 3. The apertures 10 may be arranged in multiple locations around the circumference of the upper plate 2 (on the single point line in FIG. 2). As illustrated in FIG. 3, the apertures 10 may extend through to the polishing pad 7 affixed to the upper plate 2. In other words, the apertures 10 may penetrate from the top surface of the upper plate 2 to the bottom surface of the polishing pad 7.

The wafer processing apparatus 1 may be configured to allow real-time measurement of the thickness of the work W through one or more of the apertures 10 during double-side polishing of work W. Specifically, the wafer processing apparatus 1 may comprise a work thickness measuring device 11 at a position corresponding to apertures 10. In the example illustrated in FIG. 3, the work thickness measuring device 11 is located above the upper plate 2. In this embodiment, the work thickness measuring device 11 is wavelength-variable infrared laser devices. The work thickness measuring device 11 may, for example, be provided with an optical unit that irradiates a laser beam onto the work W, a detection unit that detects the laser beam reflected from the work W, and a calculation unit that calculates the thickness of the work W from the detected laser beam. The example work thickness measuring device 11 can calculate the thickness of the work W from the difference between the optical path lengths of a reflection component of the laser beam incident on the wafer W, reflected at the front surface of the wafer and a reflection component thereof reflected at the rear surface of the work W. Note that the work thickness measuring device 11 may be of any type as long as the thickness of works can be measured in real time; accordingly, they are not limited in particular to the type using infrared laser as described above.

The wafer processing apparatus 1 comprises a controller 12. The controller 12 is connected to the upper plate 2, the lower plate 3, the sun gear 5, the internal gear 6, and the work thickness measuring device 11. The controller 12 controls each component of the wafer processing apparatus 1.

The wafer processing apparatus 1 may perform only one or two or more steps to process the work W. The steps of processing work W are also referred to as processing steps. The wafer processing apparatus 1 controls the amount of wafer processed in each processing step by setting values for one or more setting items in each processing step. In other words, the values set for each setting item performed by the wafer processing apparatus 1 specify the processing operation of the wafer processing apparatus 1. The values set for the setting items are also referred to as the setting values. In other words, the amount of wafer processed in each processing step is controlled by changing the setting values of each setting items.

The setting items in the processing step performed by the wafer processing apparatus 1 may include, for example, the polishing time of the work W or the pressure to polish the work W. Also, the setting items may include various items such as the number of rotations of the upper plate 2, or the number of revolutions or spins of the carrier plate 9.

The wafer processing apparatus 1 changes the wafer characteristics as it processes the wafer. The wafer characteristics are specified by the flatness of the surface or back of the wafer, or the thickness of the wafer. The change in the wafer characteristics before and after the wafer processing apparatus 1 performs a processing step is also referred to as the amount of wafer processed in that processing step. The wafer characteristics before it is processed by the wafer processing apparatus 1 are also referred to as pre-processing characteristics. The wafer characteristics after it has been processed by the wafer processing apparatus 1 are also referred to as post-processing characteristics. The amount of wafer processed is calculated as the difference between the pre-processing characteristics and the post-processing characteristics obtained through experiments.

When the wafer processing apparatus 1 performs a single processing step, the plurality of setting items in that processing step can affect the post-processing characteristics of the wafer in relation to each other. When the wafer processing apparatus 1 performs multiple processing steps, the plurality of setting items for each processing step can affect the post-processing characteristics of the wafer in relation to each other. Also, in the wafer production system 100, the plurality of setting items of the processing steps performed by the wafer processing apparatuses 1 can affect the post-processing characteristics of the wafer in relation to each other.

The wafer processing apparatus 1 considers the plurality of setting items that are related to each other and affect the post-processing characteristics of the wafer as a set of setting items, and sets the setting values of each setting item together. A set of setting items is collectively referred to as processing conditions. The wafer processing apparatus 1 controls the post-processing characteristics of the wafer by applying processing conditions in each processing step. The combination of the setting values for each setting item included in the processing conditions constitutes a set of setting values, also referred to as a parameter set. The wafer processing apparatus 1 controls the post-processing characteristics of the wafer by applying the parameter set as setting values for each setting item of each processing step. The parameter sets with different setting values for at least one of plurality of setting items are distinguished as different parameter sets.

The wafer processing apparatus 1 according to this embodiment may further comprise a computing unit 13 that determines, during the double-side polishing of the work W, timing of termination of the double-side polishing of the work W. The computing unit 13 is connected to the controller 12. The computing unit 13 acquires the work thickness data measured by the work thickness measuring device 11 and determines when to finish the double-sided polishing of the work W. The controller 12 may terminate the processing operation of the work W by the wafer processing apparatus 1 at the timing determined by the computing unit 13.

(Configuration Example of Processing Condition Setting Apparatus 20)

The processing condition setting apparatus 20 comprises a controller 22. The controller 22 determines the parameters that specify the processing conditions of the wafer processing apparatus 1 and outputs them to the wafer processing apparatus 1. The controller 22 is configured to communicate with the controller 12 of the wafer processing apparatus 1. The controller 22 may include at least one processor. The processor may execute programs that implement the various functions of the controller 22. The processor may be realized as a single integrated circuit. The integrated circuits are also referred to as integrated circuits (ICs). The processor may be realized as a plurality of communicatively connected integrated circuits and discrete circuits. The processor may be realized based on various other known technologies.

The processing condition setting apparatus 20 may further comprise a storage unit 24. The storage unit 24 stores, for example, the measurement results of wafer characteristics measured by an external wafer measurement device. The storage unit 24 may include an electromagnetic storage medium such as a magnetic disk, or it may include a memory such as a semiconductor memory or magnetic memory. The storage unit 24 may include a non-transitory computer readable medium. The storage unit 24 stores various information and programs executed by the controller 22. The storage unit 24 may serve as the work memory of the controller 22. At least part of the storage unit 24 may be configured as a separate entity from the controller 22.

The processing condition setting apparatus 20 may further comprise a communication unit that transmits and receives data to and from the wafer processing apparatus 1 or external devices. The communication unit may be communicably connected to other devices via a network. The communication unit may be communicably connected to other devices by wire or wirelessly. The communication unit may comprise a communication module that connects to a network or other devices. The communication module may include a communication interface such as LAN (Local Area Network). The communication module may include a communication interface for contactless communication such as infrared communication or Near Field communication (NFC). The communication module may realize the communication using various communication methods such as 4G or 5G. The communication method performed by the communication unit is not limited to the above example and may include various other methods.

(Operation Example of Processing Condition Setting Apparatus 20)

The wafer processing apparatus 1 processes a work W (wafer) by performing one or more processing steps. The post-processing characteristics of the wafer are determined based on the pre-processing characteristics of the wafer and the amount of wafer processed in the processing step performed by the wafer processing apparatus 1.

The wafer processing apparatus 1 controls the amount of wafer processed in each processing step by setting one or more of setting items in each processing step. In other words, the amount of wafer processed in each processing step is controlled by changing the setting values of the setting items set for each processing step. In the wafer production system 100 according to this embodiment, the processing condition setting apparatus 20 determines the setting values for each setting item to be set in each processing step performed by the wafer processing apparatus 1 and outputs them to the wafer processing apparatus 1. The wafer processing apparatus 1 sets the setting values determined by the processing condition setting apparatus 20 to each setting item and performs each processing step. In this way, the post-processing characteristics of the wafer are controlled.

In the wafer production system 100 according to this embodiment, the quality of the wafer after processing is evaluated based on the post-processing characteristics of the wafer. Specifically, when the post-processing characteristics of the wafer satisfy the predetermined conditions, it may be determined that the processed wafer can be delivered to the next process or can be shipped. The predetermined conditions can be determined based on the relationship between the values of indicators representing the post-processing characteristics of the wafer and reference values. The predetermined conditions may include, for example, that the values of indicators representing the post-processing characteristics of the wafer are below or equal to the reference values, or that the values are above or equal to the reference values. The predetermined conditions may include, for example, that the values of indicators representing of the post-processing characteristics of the wafer are within or outside a predetermined range.

The indicators representing the post-processing characteristics of the wafer may include, for example, an indicator representing the flatness of the wafer. The indicator representing the flatness of the wafer is also referred to as a flatness indicator.

The flatness indicator of the wafer may include, for example, GBIR (Global Backside Ideal Range). The GBIR is an indicator that expresses the flatness of the entire wafer. The GBIR can be determined as the difference between the maximum and minimum values of the shape distribution in a wafer. The smaller the GBIR value, the higher the flatness of the wafer. The flatness indicator of the wafer may include, for example, ESFQD (Edge Site flatness Front reference least sQuare Deviation). The ESFQD is an indicator that expresses the flatness of the wafer periphery. The ESFQD divides the wafer peripheral edge into a plurality of sites and evaluates the distance between the reference plane within the site and the wafer surface at each site. The smaller the maximum absolute value of ESFQD, the higher the flatness of the wafer. The flatness indicator of the wafer may include ESFQR (Edge flatness metric, Sector based, Front surface referenced, least sQuares fit reference plane, Range of the data within sector), Bump, or various other metrics such as RollOff.

The indicators of the post-processing characteristics of the wafer are not limited to flatness indicator and may include a variety of other indicators, such as an indicator representing the thickness of the wafer.

In the wafer production system 100 according to this embodiment, the controller 22 of the processing condition setting apparatus 20 determines the setting values of the setting items which is to be set in each processing step of the wafer processing apparatus 1. A wafer which will be processed by the wafer processing apparatus 1 is also referred to as a wafer to be processed. The controller 22, before actually processing a wafer to be processed with the wafer processing apparatus 1, estimates the post-processing characteristics of the wafer when the wafer to be processed has been processed with the wafer processing apparatus 1, and calculates the values of indicators representing the estimated post-processing characteristics. The controller 22 determines the setting values for each setting item based on the calculated values of the indicators.

<Estimation of Post-Processing Characteristics>

The controller 22 assumes that it applies various setting values to the setting items in the processing step performed by the wafer processing apparatus 1, so that to estimate the post-processing characteristics of the wafer when the wafer to be processed has been processed by the wafer processing apparatus 1. The controller 22 estimates the post-processing characteristics of the wafer which can be obtained when the wafer has been processed by applying the hypothetical setting values. When the wafer processing apparatus 1 applies a parameter set as setting values for each of plurality of setting items, the controller 22 assumes that the various parameter sets have been applied to the setting items and estimates the post-processing characteristics of the wafer which can be obtained when the wafer has been processed by applying each parameter set.

The controller 22 can obtain the pre-processing characteristics of the wafer in advance and estimate the post-processing characteristics of the wafer based on the pre-processing characteristics of the wafer and the estimated amount of wafer processed by the wafer processing apparatus 1 executing the processing steps. The amount of wafer processed is also referred to as the machining allowance shape or processing data. The controller 22 assumes that various setting values have been applied to the setting items in the processing step performed by the wafer processing apparatus 1, and calculates the estimated values of the processing data when the processing step is performed by applying each setting value. When the wafer processing apparatus 1 applies the parameter set as setting values for each of plurality of setting items, the controller 22 assumes that the various parameter sets have been applied to the setting items and calculates the estimated values of the processing data when the processing step is performed by applying each parameter set. The controller 22 can estimate the post-processing characteristics of the wafer based on the estimated value of the processing data and the pre-processing characteristics of the wafer.

Here, let us assume that the parameter set assumed to have been applied to the setting items in the processing step performed by the wafer processing apparatus 1 is referred to as a hypothetical parameter set. The controller 22 determines whether the estimated post-processing characteristics of the wafer will result in the desired characteristics, when the hypothetical parameter set is applied to the setting items in the processing step performed by the wafer processing apparatus 1.

The controller 22 may assume that a plurality of parameter sets is applied to the setting items as a hypothetical parameter set. The controller 22 may also assume that all possible combination of setting values for each setting item are applied to the setting items as a hypothetical parameter set. The controller 22 may assume that the combination of setting values for each setting item that is most likely to be set in the wafer processing apparatus 1 is applied to the setting items as a hypothetical parameter set.

If the controller 22 determines that the estimated post-processing characteristics of the wafer when the hypothetical parameter set is applied result in the desired characteristics, it determines that the hypothetical parameter set can actually be applied to the setting items in the processing step performed by the wafer processing apparatus 1. In other words, the controller 22 extracts, from the hypothetical parameter sets, the parameter sets for which the estimated post-processing characteristics of the wafer result in the desired characteristics. The controller 22 selects the parameter set to be actually applied from among the parameter set determined to be actually applicable to the setting items or the parameter set extracted as the result of estimating the post-processing characteristics of the wafer to be the desired characteristics.

The controller 22 calculates the values of indicators representing the post-processing characteristics of the wafer obtained when the wafer is processed by applying the hypothetical parameter set to the setting items in the processing step performed by the wafer processing apparatus 1. The controller 22 determines whether the post-processing characteristics of the wafer obtained when the wafer is processed by applying the hypothetical parameter set to the setting items will be the desired characteristics, based on the values calculated as indicators representing the post-processing characteristics.

<Extraction of Conformed Parameter Set>

The controller 22 determines that the post-processing characteristics will be the desired characteristics when the values calculated as indicators of the post-processing characteristics satisfy constraints. In other words, the controller 22 sets the constraints used to determine that the post-processing characteristics of the wafer will be the desired characteristics. The controller 22 may obtain the constraints. The controller 22 assumes that a plurality of hypothetical parameter sets is applied to setting items; and extracts, from each hypothetical parameter set that is assumed to be applied, the parameter sets for which the estimated post-processing characteristics of the wafer result in the desired characteristics. The parameter set extracted by the controller 22 is also referred to as the conformed parameter set.

When the larger the value of the indicator representing the post-processing characteristics of the wafer, the higher the quality of the wafer, the controller 22 may extract the conformed parameter set from the hypothetical parameter sets so that the value of the indicator representing the post-processing characteristics of the wafer is above or equal to the predetermined value. When the smaller the value of the indicator representing the post-processing characteristics of the wafer, the higher the quality of the wafer, the controller 22 may extract the conformed parameter set from the hypothetical parameter sets so that the value of the indicator representing the post-processing characteristics of the wafer is below or equal to the predetermined value.

The controller 22 may calculate values for each of two or more indicators of the post-processing characteristics of the wafer. The controller 22 may set constraints for each indicator and determine that the post-processing characteristics will be the desired characteristics when the value of each indicator satisfies the constraints. In other words, the controller 22 may extract, from a plurality of hypothetical parameter sets, the conformed parameter sets in which the values of each of two or more indicators satisfy the constraints.

The controller 22 may set a priority for each of two or more indicators. When the larger the value of the indicator representing the post-processing characteristics of the wafer, the higher the quality of the wafer, the controller 22 may extract the conformed parameter set from the hypothetical parameter sets so that the value of the indicator with higher priority is above or equal to the predetermined value. When the smaller the value of the indicator representing the post-processing characteristics of the wafer, the higher the quality of the wafer, the controller 22 may extract the conformed parameter set from the hypothetical parameter sets so that the value of the indicator with higher priority is below or equal to the predetermined value.

The controller 22 may calculate a comprehensive indicator based on the values of two or more indicators. When the larger the value of the comprehensive indicator, the higher the quality of the wafer, the controller 22 may extract the conformed parameter set from the hypothetical parameter sets so that the value of the comprehensive indicator is above or equal to the predetermined value. When the smaller the value of the comprehensive indicator, the higher the quality of the wafer, the controller 22 may extract the conformed parameter set from the hypothetical parameter sets so that the value of the comprehensive indicator is less or equal to the predetermined value.

Figure 4:
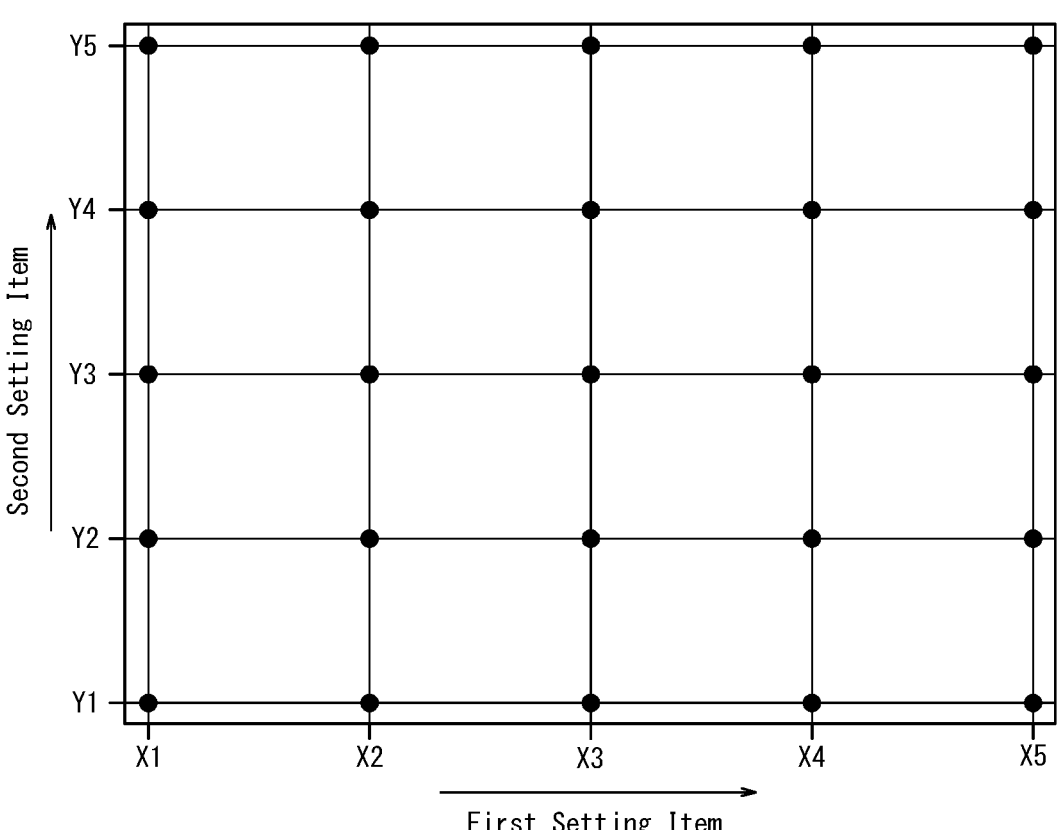
FIG. 4 is a two-dimensional graph illustrating an example of points corresponding to the parameter sets.

An example of the procedure by which the controller 22 extracts the conformed parameter sets is described below. In this example, it is assumed that the controller 22 determines the setting values for two setting items. The parameter set corresponding to the combination of the setting values of the two setting items is, as illustrated in FIG. 4, plotted as points on a two-dimensional graph with each of the two setting items as an axis. In the graph in FIG. 4, the first setting item is on the horizontal axis and the second setting item is on the vertical axis. When one of five values is set for each of the first and second setting items, the points representing the parameter set are plotted as twenty-five points on the two-dimensional graph. The setting values of the first setting item are represented by X1 to X5, and the setting values of the second setting item are represented by Y1 to Y5.

The controller 22 estimates the post-processing characteristics of the wafer obtained by the assumed process that each of the twenty-five parameter sets is applied to the setting items. Assume that the post-processing characteristics of the wafer are represented by the first and second indicators. In this example, the first and second indicators are GBIR and ESFQD, respectively. The smaller the GBIR value, the closer the wafer is to flatness; and the larger the ESFQD value, the closer the wafer is to flatness. The controller 22 calculates the values of the first and second indicators representing the post-processing characteristics obtained by the assumed process that each of the parameter sets is applied to the setting items.

The controller 22 may interpolate values between the setting values discretely set in the first or second setting item on a two-dimensional graph. For example, if one value is interpolated between the five setting values for each setting item, eighty-one parameter sets by 9×9 will be assumed. The controller 22 may estimate the post-processing characteristics of the wafer resulting from the assumed process that each parameter set including interpolated values is applied to the setting item.

The conformed parameter sets may be extracted, for example, as described below.

Figure 5:
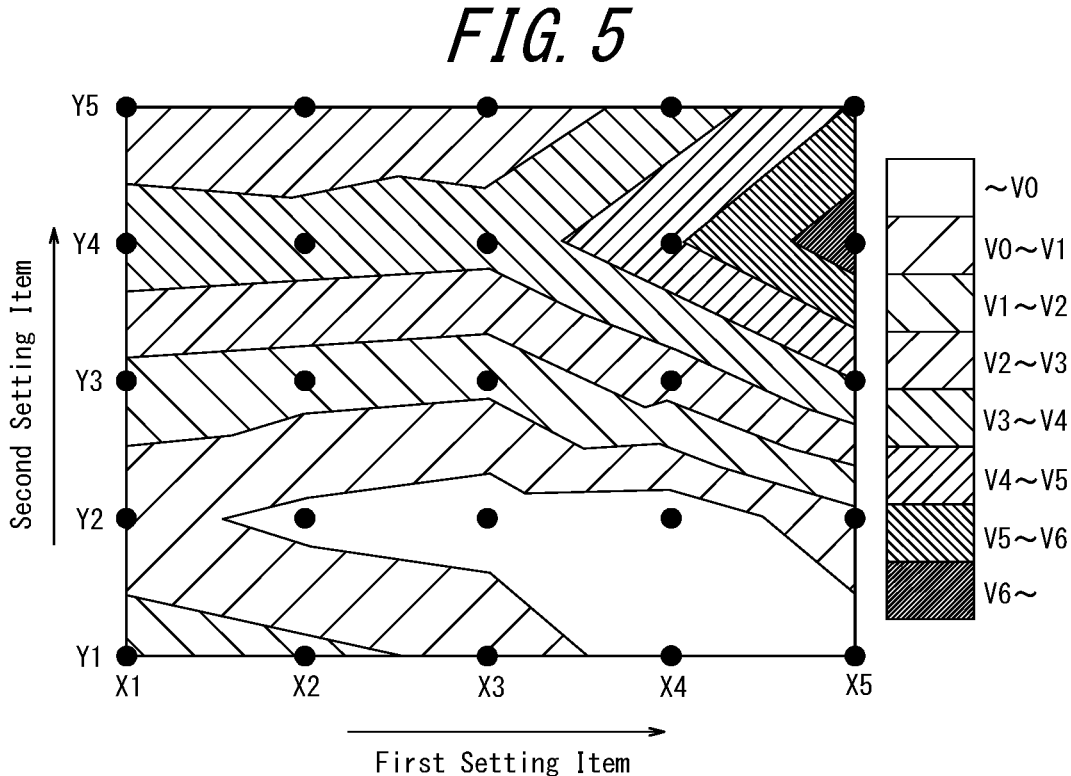
FIG. 5 is a two-dimensional graph mapping the values of the first indicator representing the post-processing characteristics of each parameter set.
Figure 6:
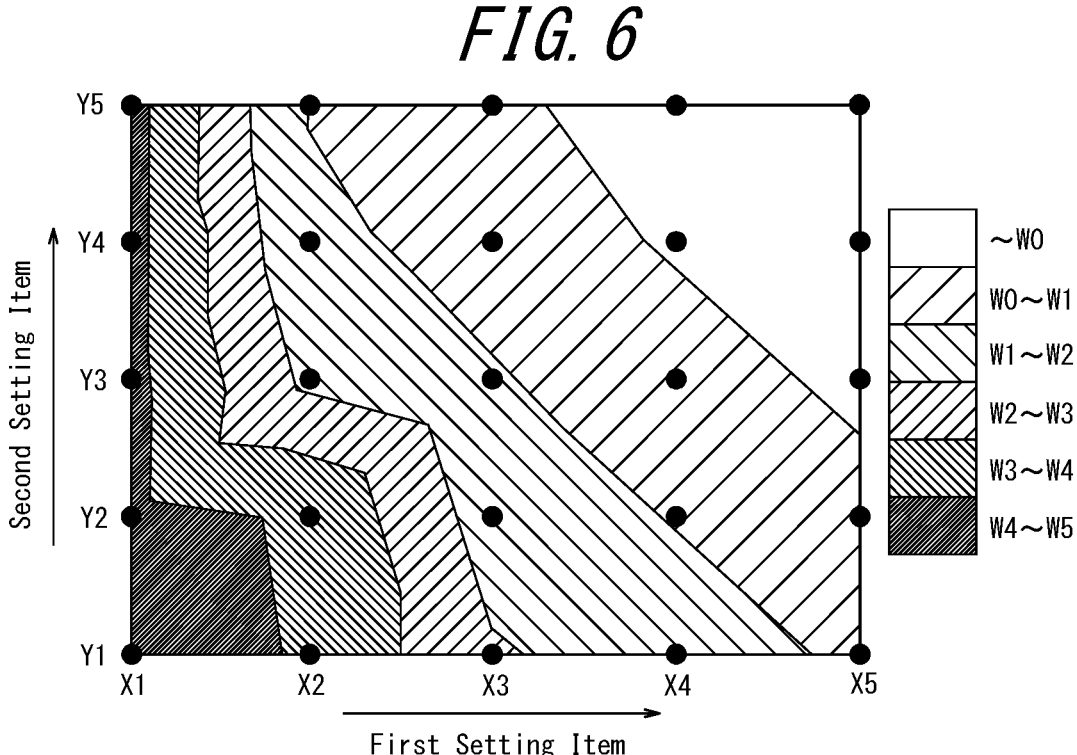
FIG. 6 is a two-dimensional graph mapping the values of the second indicator representing the post-processing characteristics of each parameter set.

As shown in FIGS. 5 and 6, the values of the first and second indicators representing the post-processing characteristics obtained by applying each parameter set to the setting items are mapped onto a two-dimensional graph where the points representing each parameter set are plotted.

FIG. 5 is a two-dimensional graph mapping the values of the first indicator (GBIR). The values of the first indicator are mapped in eight levels, as shown in the legend. For example, the area represented by white (−V0) indicates that the value of the first indicator is below V0. The area represented by the sparse right ascending shaded line (V0-V1) indicates that the value of the first indicator is above or equal to V0 and below V1. Also, the area represented by the dense right ascending shaded line (V6−) indicates that the value of the first indicator is above or equal to V6.

FIG. 6 is a two-dimensional graph mapping the values of the second indicator (ESFQD). The values of the second indicator are mapped in six levels, as shown in the legend. For example, the area represented by white (−W0) indicates that the value of the second indicator is below W0. The area represented by the sparse right ascending shaded line (W0-W1) indicates that the value of the second indicator is above or equal to W0 and below W1. Also, the area represented by the dense right ascending shaded line (W4-W5) indicates that the value of the second indicator is above or equal to W4 and below or equal to W5.

Figure 7:
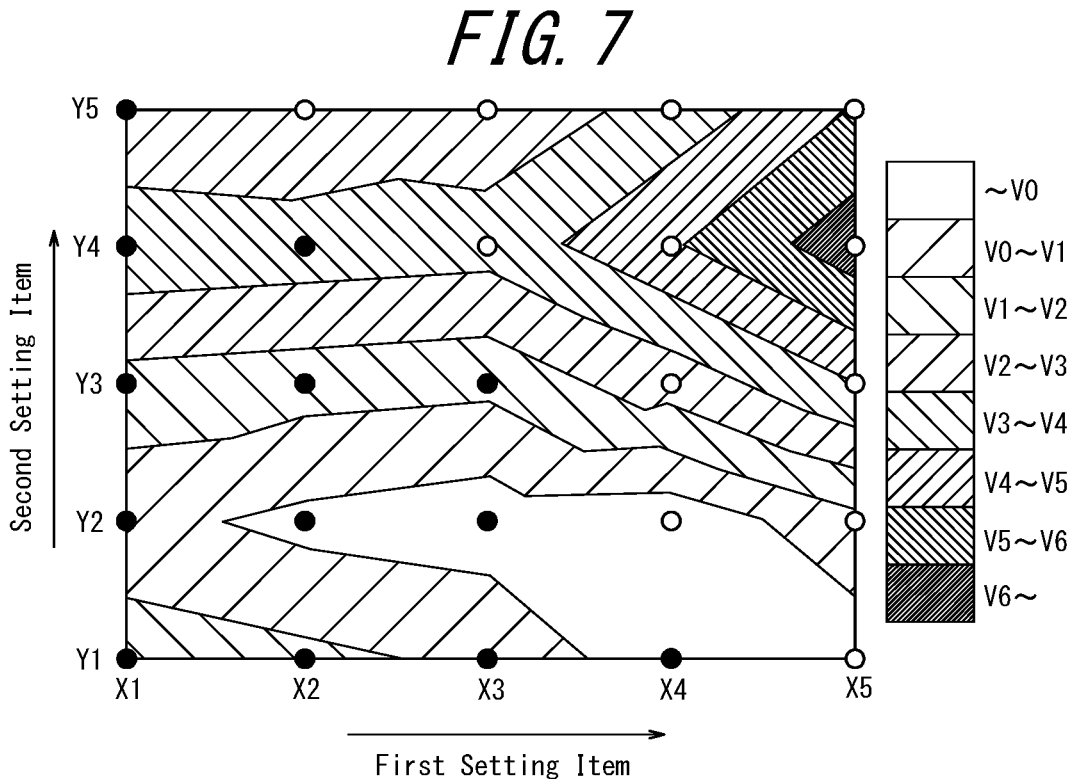
FIG. 7 is a two-dimensional graph with solid circles (black circles) representing the parameter sets extracted based on the values of the second indicator in the two-dimensional graph of FIG. 5.
Figure 8:
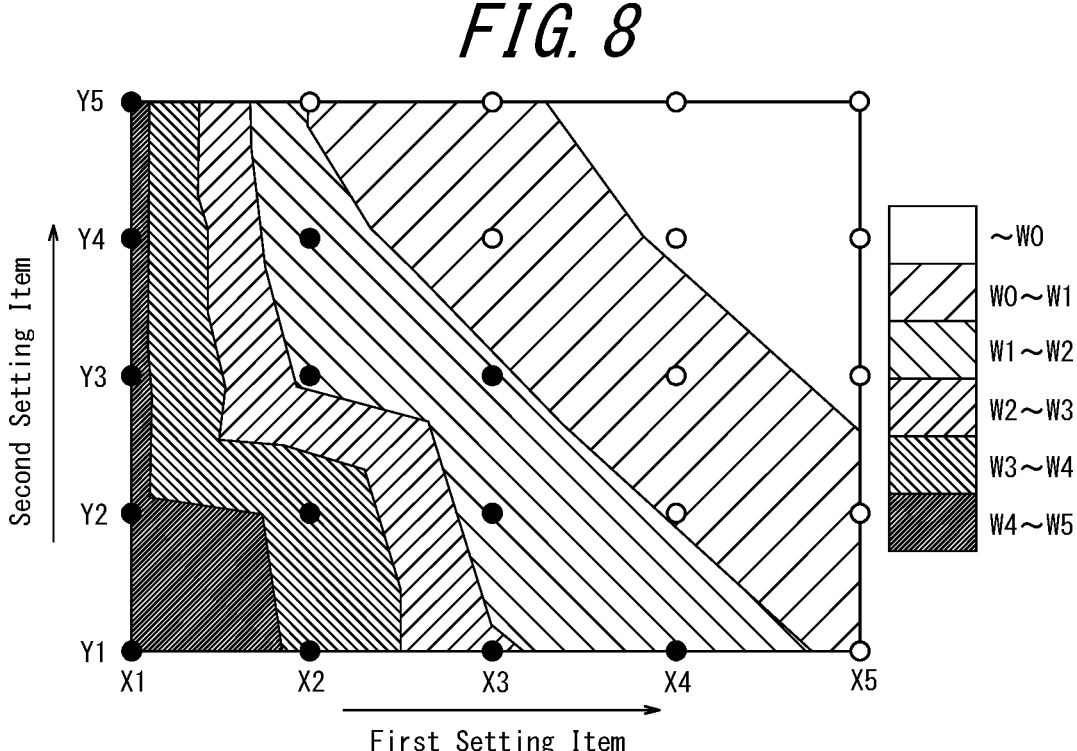
FIG. 8 is a two-dimensional graph with solid circles (black circles) representing the parameter sets extracted based on the values of the second indicator in the two-dimensional graph of FIG. 6.

Here, the controller 22 extracts the parameter sets for which the value of the second indicator (ESFQD) falls within the predetermined numerical range. As shown in FIGS. 7 and 8, the extracted parameter sets are represented by solid circles (black circles). The parameter sets that were not extracted are represented by a hollowed-out circle (white circle). The values of the first indicator for each parameter set in FIG. 7 are the same as in FIG. 5. The values of the second indicator for each parameter set in FIG. 8 are the same as in FIG. 6.

Figure 9:
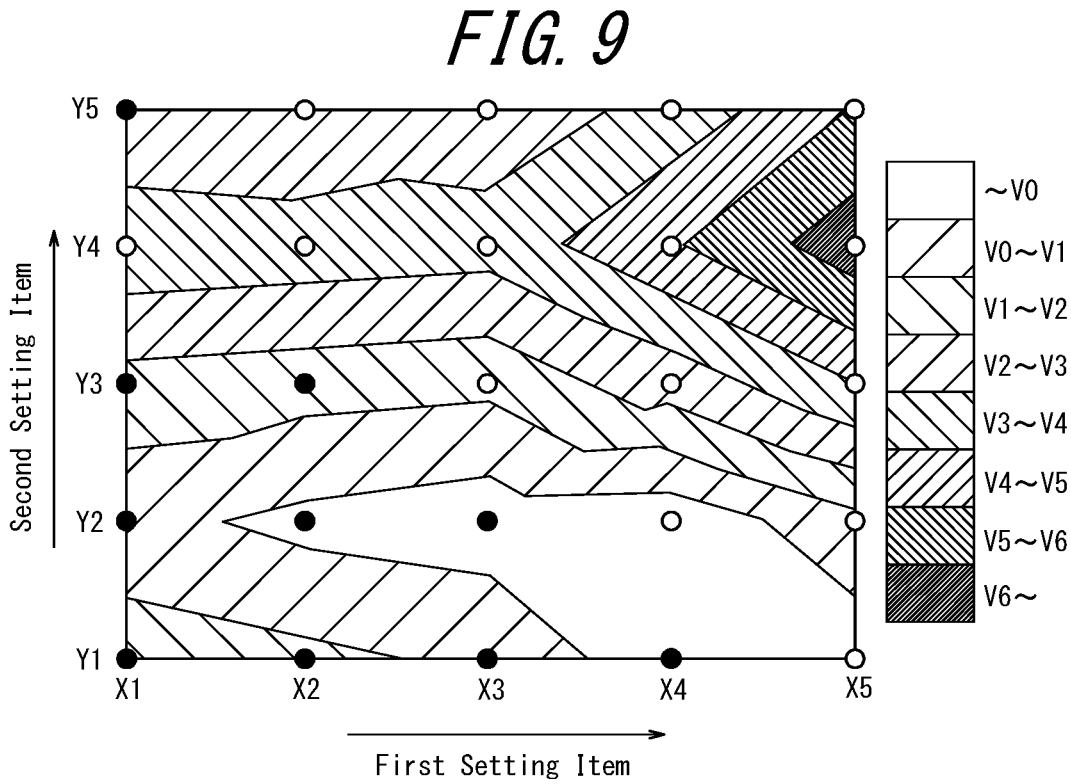
FIG. 9 is a two-dimensional graph with solid circles (black circles) representing the parameter sets extracted based further on the values of the first indicator in the two-dimensional graph of FIG. 7.
Figure 10:
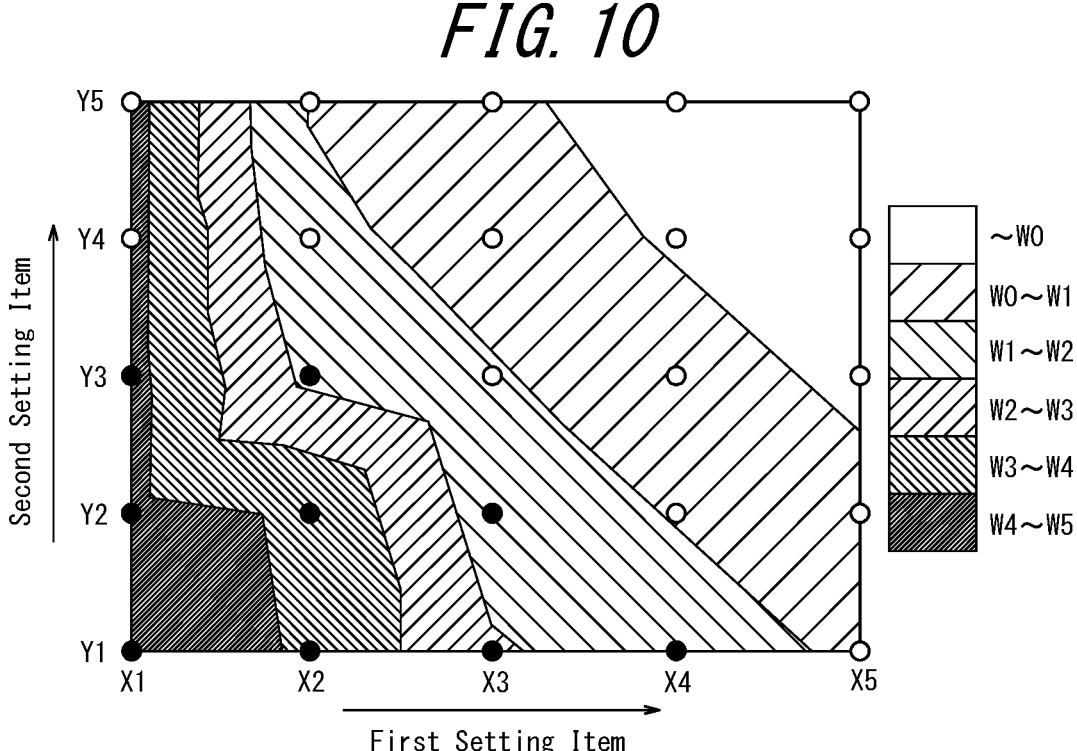
FIG. 10 is a two-dimensional graph with solid circles (black circles) representing the parameter sets extracted based further on the values of the first indicator in the two-dimensional graph of FIG. 8.

Furthermore, the controller 22 extracts those parameter sets for which the value of the first indicator (GBIR) is below or equal to the predetermined value, as the conformed parameter sets, from the parameter sets extracted based on the second indicator. As shown in FIGS. 9 and 10, the extracted conformed parameter sets are represented by solid circles (black circles). The parameter sets that were not extracted are represented by a hollowed-out circle (white circle). The values of the first indicator for each parameter set in FIG. 9 are the same as in FIGS. 5 and 7. The values of the second indicator for each parameter set in FIG. 10 are the same as in FIGS. 6 and 8.

In some cases, the conformed parameter set may not exist because the constraints are too restrictive. In other words, the controller 22 may not be able to extract the conformed parameter set. When there is no conformed parameter set, the controller 22 may change the constraints. For example, the controller 22 may expand the range of values for the indicators representing the constraints. When setting a constraint where the value of indicator to be above or equal to a predetermined value, the controller 22 may expand the range of value for the indicator by decreasing the predetermined value. When setting a constraint where the value of indicator to be below or equal to a predetermined value, the controller 22 may expand the range of value for the indicator by increasing the predetermined value. The controller 22 may change the constraint from the indicator with the lower priority.

The conformed parameter sets can be extracted as described above.

<Selection of Processing Parameter Set>

The controller 22 selects a parameter set which is to be applied to the setting items when the wafer processing apparatus 1 actually processes the wafer to be processed, from among the conformed parameter sets. The parameter set that is applied to the setting items when the wafer processing apparatus 1 actually processes the wafer to be processed is also referred to as a processing parameter set.

The controller 22 may, for example, obtain a target value for the indicator and select a processing parameter set so that the difference between the value of the indicator and the target value approaches zero. The controller 22 may select a processing parameter set so that the absolute value of the difference between the value of the indicator and the target value is small. The controller 22 may select a processing parameter set to minimize the absolute value of the difference between the value of the indicator and the target value.

When selecting a processing parameter set based on two or more indicators, the controller 22 may set priority for each indicator and select a processing parameter set so that the difference between the value of the indicator with the higher priority and the target value approaches zero.

<<Classification of Parameter Groups>>

The controller 22 may classify the conformed parameter sets into parameter groups. If the number of conformed parameter sets is one, then that one conformed parameter set is classified into one parameter group. If the number of conformed parameter sets is two or more, the conformed parameter sets may be classified into one or more parameter groups such that each parameter group contains at least one conformed parameter set. All conformed parameter sets may be classified into one parameter group.

Figure 11:
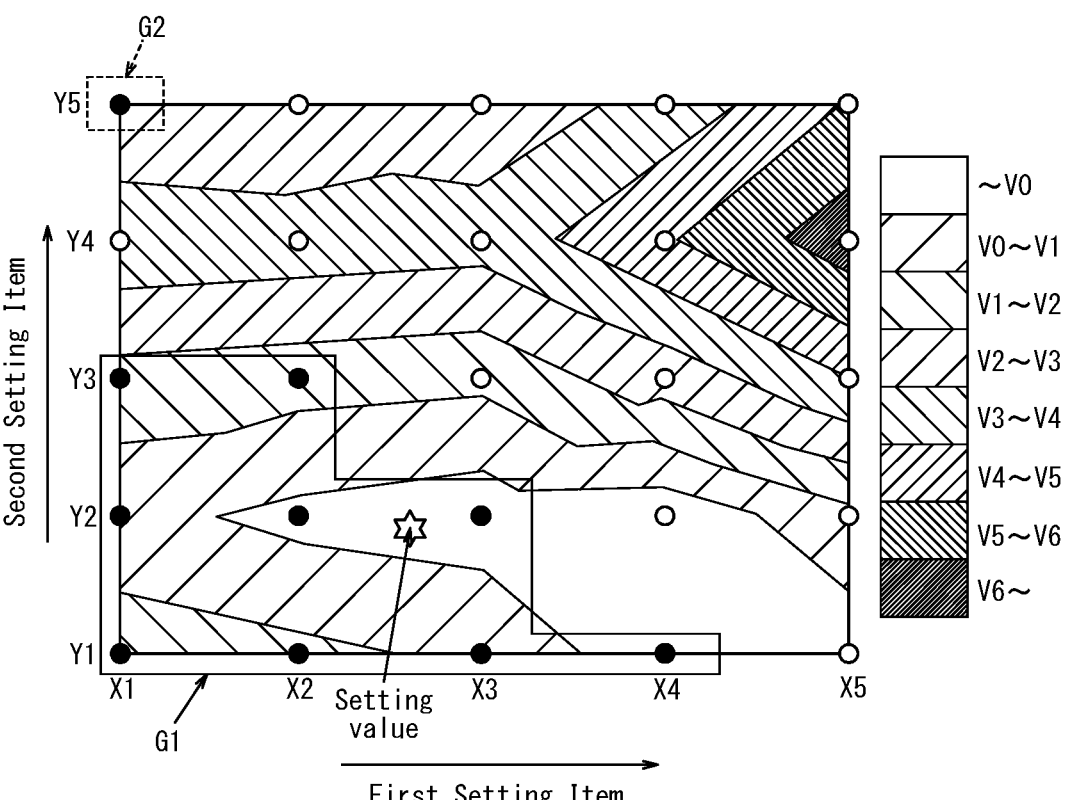
FIG. 11 is a two-dimensional graph representing an example of classifying conformed parameter sets into parameter groups.

The controller 22 may, for example as shown in FIG. 11, classify the conformed parameter sets into a first parameter group G1 and a second parameter group G2. The first parameter group G1 includes the parameter sets represented by the nine points enclosed in the solid box. The second parameter group G2 includes the parameter set represented by the single point enclosed in the dashed box. The values of the first indicator for each parameter set in FIG. 11 are identical to those in FIGS. 5, 7 and 9.

The controller 22 may classify the adjacent conformed parameter sets on the two-dimensional graph into one group. The controller 22 may determine that two points that differ by only one setting item are adjacent. Specifically, the controller 22 may determine that the point (X1, Y1) is adjacent to the points (X2, Y1) and (X1, Y2). The determination of adjacency when only one setting item differs corresponds to the labeling by extracting four nearby locations, which is used in the field of image processing.

The controller 22 classifies the conformed parameter set represented by the point (X1, Y1) and the conformed parameter set represented by the points (X2, Y1) and (X1, Y2) adjacent to that point into the first parameter group G1. The controller 22 further classifies the conformed parameter sets represented by the points (X3, Y1), (X4, Y1), (X2, Y2), (X3, Y2), (X1, Y3) and (X2, Y3) adjacent to those points into the first parameter group G1. The points (X1, Y4) and (X2, Y5) adjacent to the point (X1, Y5) representing the conformed parameter set do not represent the conformed parameter set.

Therefore, the controller 22 classifies the conformed parameter set represented by the point (X1, Y5) alone into the second parameter group G2.

The controller 22 may determine that two points that differ by one each in the first and second setting item are adjacent. That is, the controller 22 may determine that two points located diagonally to each other on a two-dimensional graph are adjacent. Specifically, the controller 22 may determine that the points (X1, Y1) and (X2, Y2) are adjacent. For example, assume that the parameter set represented by the point (X4, Y3) is the conformed parameter set. In this case, the controller 22 may determine that the parameter set represented by point (X4, Y3) is adjacent to the conformed parameter set represented by point (X3, Y2) and classify it as the first parameter group G1. The determination of adjacency even if the two setting items are different from each other corresponds to the labeling by extracting eight nearby locations, which is used in the field of image processing.

The method of classifying parameter sets in cases where the parameter set includes a combination of setting values for three or more setting items is described below.

The controller 22 may select one of the parameter groups. The selected parameter group is also referred to as the selected group.

The controller 22 may select one parameter group that has the largest number of parameter sets classified into the parameter group. In the example in FIG. 11, the number of parameter sets (nine sets) classified in the first parameter group G1 is greater than the number of parameter sets (one set) classified in the second parameter group G2. Therefore, the controller 22 may select the first parameter group G1 as the selected group.

The controller 22 may calculate statistics of the indicators of post-processing characteristics of the wafer obtained by applying parameter sets classified into each parameter group. The controller 22 may calculate the mean or variance, etc., of the indicators when the parameter sets classified into each parameter group are applied, as statistics for each parameter group. The controller 22 may select one parameter group based on the statistics of each parameter group. For example, the controller 22 may select a parameter group so that the average value of the indicators of the selected group is closest to the target value of the constraints. The controller 22 may set priority for each of two or more indicators and select a parameter group so that the average value of the indicators with the higher priority is closest to the target value of the constraints.

The controller 22 may select, as the selected group, a parameter group in which the range of setting value for each setting item is well-balanced so that the variation in the value of indicator is easily kept below or equal to a predetermined value. Suppose that a third parameter group that includes the points (X1, Y1), (X2, Y1), (X3, Y1) and (X4, Y1) is set up, and also that a fourth parameter group that includes the points (X1, Y3), (X2, Y3), (X1, Y4) and (X2, Y4) is set up. The fourth parameter group is closer to an even spread of each of the first and second setting items than the third parameter group. In other words, the range of setting values in the fourth parameter group is spread out with better balance than that of in the third parameter group. In this case, the controller 22 may select the fourth parameter group as the selected group rather than the third parameter group. By selecting in this way, in the case of selecting a processing parameter set from a selected group as described below, it is easy to select a processing parameter set so that the value of the indicator is less likely to fluctuate even if the setting values fluctuate due to disturbances. In other words, the robustness of processing conditions can be increased. As a result, the quality of wafers after processing can be improved.

<<Selecting Processing Parameter Set from Selected Group>>

The controller 22 may select a processing parameter set from the conformed parameter sets included in the selected group. The controller 22 may select a processing parameter set based on the values of indicators calculated for each parameter set in the selected group. The controller 22 may select a parameter set with the highest number of adjacent parameter sets as the processing parameter set. By selecting in this way, the value of the indicator is less likely to fluctuate even if the setting value changes due to disturbances. In other words, the robustness of the processing conditions can be increased. As a result, the quality of wafers after processing can be improved.

The parameter sets represent the setting values of setting items in discrete values. The controller 22 may set values between the discrete values as the setting items. For example, as shown by the star in FIG. 11, the value identified by the point located between the points representing the conformed parameter sets may be set to the setting item. The star-shaped position shown in FIG. 11 is located away from the boundary (roughly in the center) of the area, where the first indicator is the smallest (the area represented in white) in the first parameter group G1; and the corresponding parameter set is set in the setting items. In this way, the value of the indicator is less likely to fluctuate even if the setting value changes due to disturbances. In other words, the robustness of the processing conditions can be increased. As a result, the quality of wafers after processing can be improved.

(Example of Processing Condition Setting Method)

Figure 12:
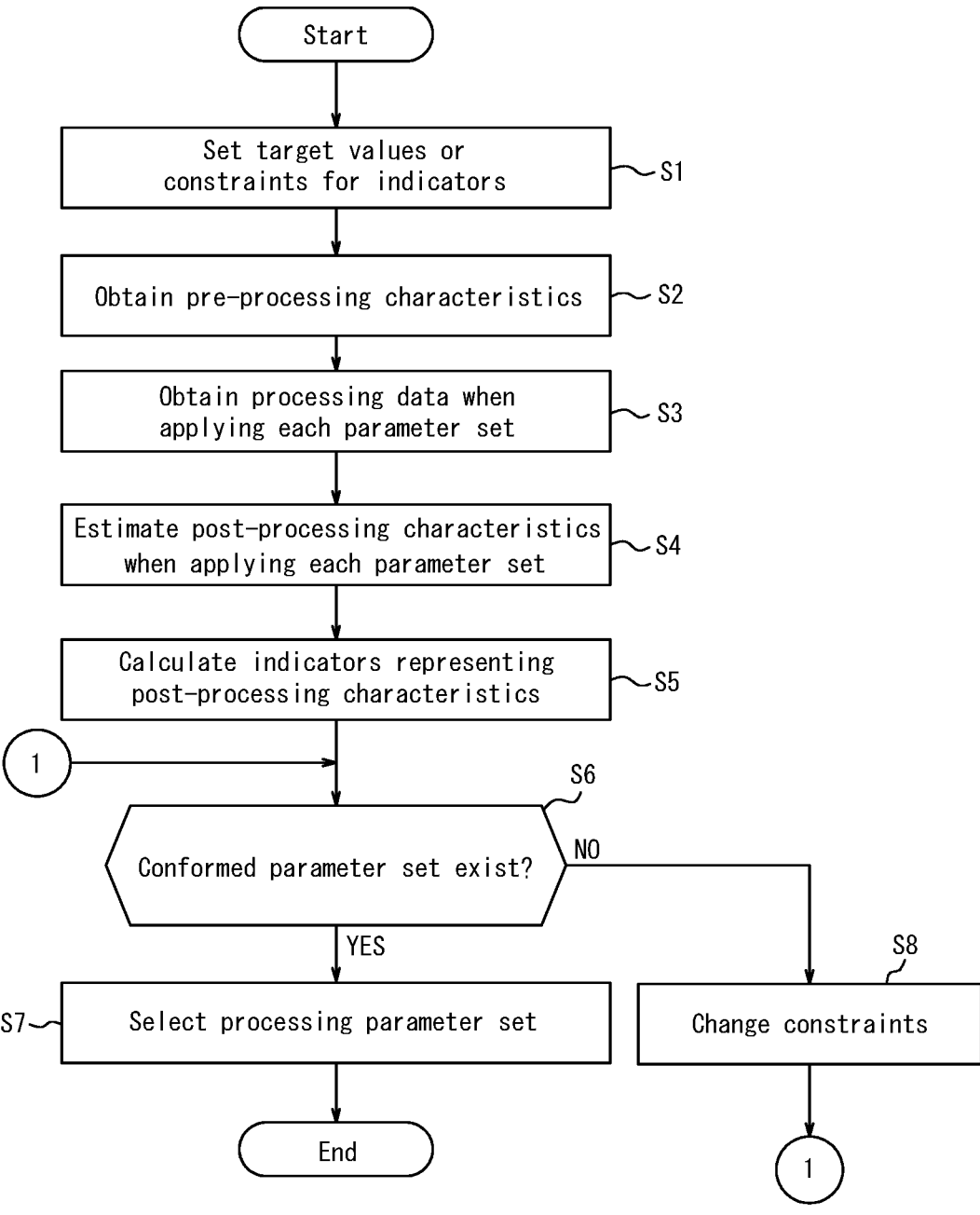
FIG. 12 is a flowchart illustrating an example of a procedure of the processing condition setting method in accordance with one embodiment of the present disclosure.

The controller 22 may select a processing parameter set, for example, by executing a processing condition setting method that includes the steps of the flowchart illustrated in FIG. 12. The processing condition setting method may be realized as a processing condition setting program to be executed by the controller 22.

The controller 22 sets the target values or constraints for indicators (step S1).

The controller 22 obtains the pre-processing characteristics of the wafer to be processed (step S2).

The controller 22 obtains the processing data when each of the plurality of parameter sets is applied to the setting items (step S3). The processing data represents the difference between the pre-processing characteristics and the post-processing characteristics of the wafer processed by applying each parameter set to the setting items.

The controller 22 estimates the post-processing characteristics of the wafer processed by applying each parameter set to the setting items (step S4). Specifically, the controller 22 estimates, based on the pre-processing characteristics of the wafer to be processed obtained in the step S2 and the processing data obtained in the step S3, the post-processing characteristics of the wafer when each parameter set has been applied to the setting items when the wafer processing apparatus 1 processes the wafer.

The controller 22 calculates the values of the indicators representing the post-processing characteristics estimated for each parameter set (step S5).

The controller 22 determines whether a conformed parameter set exists based on the values of the indicators corresponding to each parameter set (step S6). Specifically, the controller 22 determines whether the values of the indicators corresponding to each parameter set satisfies the constraints. The controller 22 determines that a conformed parameter set exists when the values of the indicators corresponding to at least one of the parameter sets which is assumed to apply to the setting items satisfies the constraints. The controller 22 determines that a conformed parameter set does not exist when the values of the indicators corresponding to all parameter sets which are assumed to apply to the setting items do not satisfy the constraints.

If a conformed parameter set exists (step S6: YES), the controller 22 selects a processing parameter set from the conformed parameter sets (step S7). The controller 22 may perform, as the procedure of step S7, the procedure illustrated in the flowchart in FIG. 13 which will be described below. After executing the procedure in step S7, the controller 22 terminates the execution of the procedure illustrated in the flowchart in FIG. 12.

If a conformed parameter set does not exist (step S6: NO), the controller 22 changes the constraints for the indicators (step S8). The controller 22 may change the target values of the indicators. The controller 22 returns to the procedure in step S6 after executing the procedure in step S8.

Figure 13:
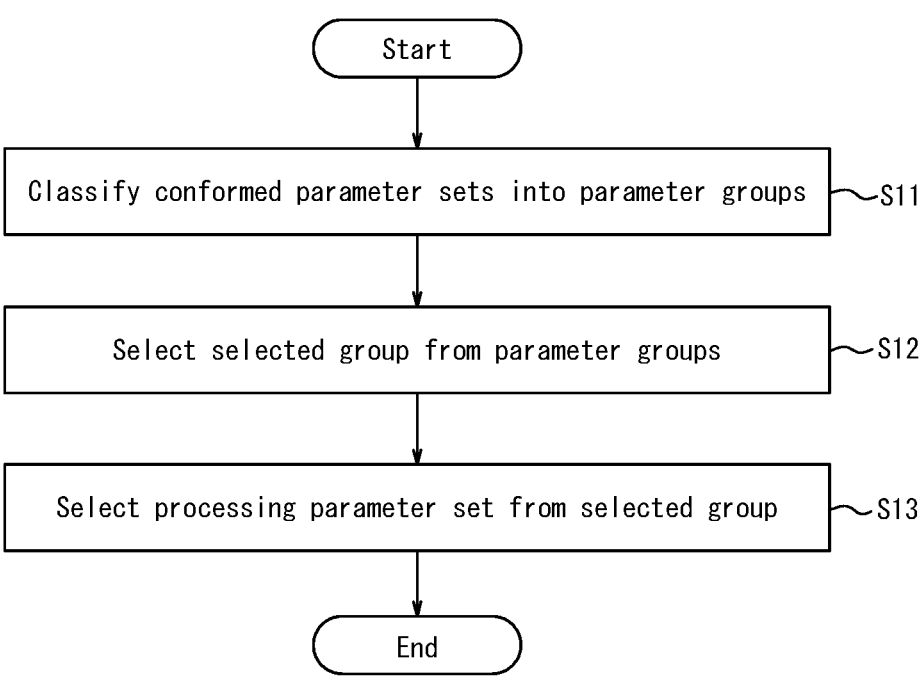
FIG. 13 is a flowchart illustrating an example of the procedure for selecting a processing parameter set.

The controller 22 may perform, as the procedure of step S7, the procedure illustrated in the flowchart in FIG. 13, for example.

The controller 22 classifies the conformed parameter sets into parameter groups (step S11).

The controller 22 selects a selected group from the parameter groups (step S12). If the number of parameter groups is one, the controller 22 selects that one parameter group as the selected group. If the number of parameter groups is two or more, the controller 22 selects one parameter group as the selected group.

The controller 22 selects a processing parameter set from the parameter sets included in the selected group (step S13). After the controller 22 executes the procedure in step S13, it terminates the execution of the procedure illustrated in flowchart in FIG. 13.

Comparative Example

Figure 14:
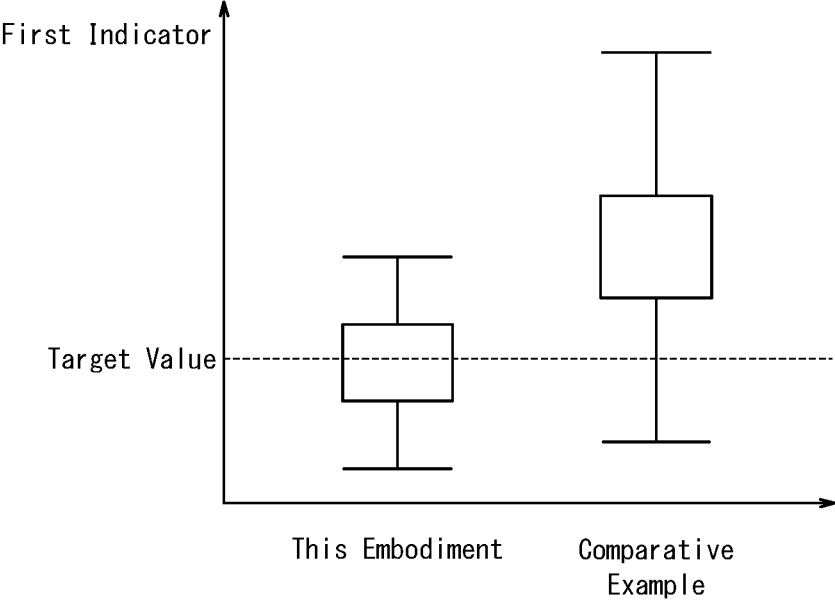
FIG. 14 illustrates the distribution of the values of the first indicator of post-processing characteristics of wafers processed in the example of this disclosure configuration and the comparative example, respectively.

As described above, in this embodiment, the processing condition setting apparatus 20 selects a processing parameter set that collectively sets the values for a plurality of setting items. As a comparative example, suppose that the value of one setting item is set individually. Referring to FIG. 14, the post-processing characteristics of wafers obtained by the setting method according to this embodiment are compared with the post-processing characteristics of wafers obtained by the setting method of the comparative example.

Here, let us assume that the wafer processing apparatus 1 processes a plurality of wafers by applying the setting values, determined by the respective setting methods of this embodiment and the comparative example, to the setting items. FIG. 14 is a graph illustrating the distribution of values of the first indicator representing the post-processing characteristics of each processed wafer. The vertical axis represents the value of the first indicator. The horizontal axis represents the distinction between this embodiment and the comparative cases. In FIG. 14, which is shown as a rectangle is the range of values obtained by increasing or decreasing the standard deviation with respect to the mean of the values of the first indicator. The range from the maximum to the minimum value of the first indicator is represented as a vertical line. Also, the target value of the first indicator is represented by a dashed line.

The variation in the value of the first indicator is smaller when the setting values determined by the method according to this embodiment were applied to the setting items than when the setting values determined by the setting method of the comparative example were applied to the setting items. Also, the average value of the first indicator is closer to the target value when the setting values determined by the method according to this embodiment were applied to the setting items than when the setting values determined by the setting method of the comparative example were applied to the setting items.

As illustrated in FIG. 14, according to this processing condition setting method, by collectively setting the values of a plurality of setting items, it is easier to bring the indicators representing the post-processing characteristics of the wafer closer to the target values.

As described above, in the wafer production system 100 according to this embodiment, the setting values for each of the plurality of setting items in the processing step executed by the wafer processing apparatus 1 are determined by the processing condition setting apparatus 20. By collectively determining the setting values of a plurality of setting items, the quality of wafers after processing can be improved compared to the case where the setting value of one setting item is determined independently. In other words, the target desired post-processing characteristics could be set to the characteristics that indicate the wafers are of high quality.

In the wafer production system 100 according to this embodiment, the processing condition setting apparatus 20 determines the setting values to be applied to the plurality of setting items as the processing conditions when processing the wafer to be processed. The processing condition setting apparatus 20 may determine the setting values to be applied to the plurality of setting items included in a single processing step. The processing condition setting apparatus 20 may perform the determination of setting values to be applied to the plurality of setting items included in a single processing step, for the multiple processing steps. In other words, the processing condition setting apparatus 20 may determine the setting values to be applied to the plurality of setting items in each of the plurality of processing steps. The processing condition setting apparatus 20 may determine the setting value to be applied to a single setting item in each of the plurality of the processing steps.

OTHER EMBODIMENTS

Other embodiments are described below.
<Determining Parameter Set to be Applied to Three or More Setting Items>
As mentioned above, the parameter sets applicable to two setting items were represented as points on a two-dimensional graph (plane). Determining whether two parameter sets, represented as points on a plane, are adjacent is intuitively understandable to humans because it is a lower dimension than in the real world, which is a three-dimensional space. The parameter sets to be applied to the three setting items can be represented as points in three-dimensional space. Determining whether two parameter sets, represented as points in a three-dimensional space, are adjacent is also intuitively understandable to humans because it is the same dimension as the real world.

However, the parameter sets to be applied to four or more setting items are difficult to understand intuitively because they are represented as points in a space of four or more dimensions, which is a higher dimension than the real world. Therefore, in order to facilitate understanding when applying the parameter sets to four or more setting items, the controller 22 shall map the parameter sets applied to the plurality of setting items to the grid points defined in a multidimensional vector space with each setting item as a basis.

The controller 22 determines whether two parameter sets are adjacent in a multidimensional vector space. The grid points can be represented as a vector with each setting item as an element. For example, suppose the four setting items are represented by P, Q, R and S. Let us assume that the setting value of the setting item P is represented by one of $\{P1, P2, \ldots, Pn\}$. Among the setting values, the setting values that differ in sign value by 1 are adjacent to each other. Specifically, P1 and P2 are adjacent to each other. Similarly, Pn−1 and Pn are adjacent to each other. Assume that the setting values are expressed for the setting items Q, R and S in the same way as for the setting item P. The grid point is represented, for example, as (P1, Q1, R1, S1).

Whether two grid points are adjacent is determined by comparing the values of each element of the grid points. In this embodiment, it is assumed that in a comparison of each element of two grid points, if three of the four elements have the same value and the value of one other element is adjacent, the two grid points are determined to be adjacent. To generalize the expression, if the number of setting items is m, and (m−1) elements have the same value and one other element has an adjacent value, then the two grid points are determined to be adjacent.

In determining whether two grid points are adjacent, a comparison of each element of two grid points may determine that the two grid points are adjacent if (m−2) of the m elements have the same value and the values of each of the other two elements are adjacent. The case in which the values of two elements are adjacent corresponds to the case where they are diagonally adjacent on a two-dimensional (plane) graph.

The controller 22 classifies the grid points adjacent to each other into the same grid point group. The controller 22 classifies the parameter sets, of the conformed parameter sets, that are represented by grid points that are classified into the same grid point group into the same parameter group.

As mentioned above, the controller 22 can easily determine whether two parameter sets are adjacent to each other by mapping the parameter sets to grid points in a multidimensional vector space. As a result, the controller 22 can easily classify parameter sets.
<Action when Conformed Parameter Set does not Exist>
The controller 22 selects a processing parameter set from the conformed parameter set. However, the conformed parameter set may not exist even when the constraints are changed. In this case, the controller 22 may set a predetermined initial parameter set as the processing parameter set. The controller 22 may store a setting history of the processing parameter sets in the storage unit 24 and select the current processing parameter set from the previously set processing parameter sets. The controller 22 may set the processing parameter set that was set in the previous processing as the processing parameter set for the current processing.
<Example of Apparatus Configuration>
In the wafer production system 100, the wafer processing apparatus 1 may comprise at least a part of the processing condition setting apparatus 20. The wafer processing apparatus 1 and the processing condition setting apparatus 20 may be configured separately from each other.

The wafer production system 100 may comprise a plurality of wafer processing apparatuses 1. The wafer production system 100 may produce wafers by processing work W with a plurality of wafer processing apparatuses 1. Each of the wafer processing apparatus 1 may perform different processing steps on the work W. The processing condition setting apparatus 20 may set the processing conditions in the processing steps executed by each of the plurality of the wafer processing apparatuses 1. In other words, the processing condition setting apparatus 20 may set the processing conditions in each of the plurality of processing steps of the entire wafer production system 100.

<Example of How to Classify Parameter Sets>

The controller 22 may calculate a numerical value representing the difference between two different parameter sets in order to classify the parameter sets. The numerical value representing the difference between two different parameter sets is also referred to as the inter-parameter distance. If the inter-parameter distance of two conformed parameter sets is below or equal to a predetermined value, the controller 22 may classify the two conformed parameter sets into the same parameter group.

For example, suppose the three setting items are represented by A, B, and C. Assume that the controller 22 sets (A1, B1, C1) as the first hypothetical parameter set and (A2, B2, C2) as the second hypothetical parameter set. Let the distance (D) between the parameters of the first and second hypothetical parameter sets be calculated by the following equation (1). The $\omega_A$, $\omega_B$ and $\omega_C$ are the weighting factors for each setting item. The weighting factors represent the degree to which each setting item contributes to the processing data of the wafer. The more significantly the setting item contributes to the processing data of the wafer, the higher the weighting factor for that setting item may be set.

[Formula 1]

$$D = \sqrt{(A1 - A2)^2 \cdot \omega_A + (B1 - B2)^2 \cdot \omega_B + (C1 - C2)^2 \cdot \omega_C} \quad (1)$$

The classification of parameter sets based on the inter-parameter distance facilitates the classification of parameter sets even when the setting values assumed to apply to each setting item are at indefinite intervals. As a result, the degree of freedom of the values set for each setting item can be increased.

Although the embodiments pertaining to the present disclosure have been described based on the drawings and examples, it should be noted that one skilled in the art can make various changes or modifications based on the present disclosure. Therefore, it should be noted that these variations or modifications are included within the scope of this disclosure. For example, the functions included in each component or step can be rearranged in a logically consistent manner, and multiple components or steps can be combined or divided into one. Although the embodiments pertaining to the present disclosure have been described with a focus on apparatus, the embodiments pertaining to the present disclosure can also be realized as a method that includes steps executed by each component of the apparatus. The embodiments pertaining to the present disclosure can also be realized as a method executed by a processor provided with the apparatus, a program, or a storage medium recording the program. It should be understood that the scope of this disclosure includes these as well.

The graphs included in this disclosure are schematic. Scales, etc., do not necessarily correspond to reality.

INDUSTRIAL APPLICABILITY

According to the embodiments of the present disclosure, the quality of processed wafers can be improved.

The invention claimed is:

1. A processing condition setting apparatus comprising a controller that selects a parameter set to be applied to a wafer processing apparatus from a plurality of parameter sets, each of the parameter sets includes a combination of setting values set for each of a plurality of setting items that specify processing operation of the wafer processing apparatus, each of the setting items is applied in one processing step performed by the wafer processing apparatus, the controller, before the wafer processing apparatus processes a wafer to be processed:

obtains changes in wafer characteristics before and after processing when a wafer is processed by applying each of the parameter sets, as processing data for each of the parameter sets;

obtains pre-processing characteristics of the wafer to be processed;

estimates, for each of the parameter sets, post-processing characteristics of the wafer to be processed, based on the pre-processing characteristics of the wafer to be processed and the processing data, assuming that the wafer to be processed has been processed by applying each of the parameter sets, and calculates two or more indicators for each of the post-processing characteristics;

obtains constraints on the indicators; and selects a parameter set, which is to be applied to the wafer processing apparatus when processing the wafer to be processed, from among conformed parameter sets in which the indicators satisfy the constraints, wherein the controller further:

classifies the conformed parameter sets into parameter groups;

selects one parameter group from the parameter groups as a selected group;

selects a parameter set, which is to be applied when processing the wafer to be processed, from the conformed parameter sets classified in the selected group, as a processing parameter set;

maps each of the parameter sets to a grid point defined in a multidimensional vector space with each of the setting items as a basis;

classifies grid points that correspond to the conformed parameter sets and are adjacent to each other in the multidimensional vector space into the same grid point group; and classifies the parameter sets that correspond to the grid points classified in the grid point group into the same parameter group.

2. The processing condition setting apparatus according to claim 1, wherein the controller further:

obtains target values for the indicators; and sets priority for each of the two or more indicators and selects the processing parameter set so that the indicator with the higher priority is closer to the target values.

3. The processing condition setting apparatus according to claim 2, wherein the controller expands the range of constraints for indicators with lower priority when there is no parameter set for which the indicators satisfy the constraints, so that to extract a parameter set for which the indicators satisfy the constraints.

4. The processing condition setting apparatus according to claim 3, wherein the controller selects a predetermined initial parameter set or a parameter set of the previous processing as the parameter set to be applied when processing the wafer to be processed, when there is no parameter set for which the indicators satisfy the constraints even after expanding the range of the constraints.

5. The processing condition setting apparatus according to claim 4, wherein the controller selects one parameter group that has the largest number of parameter sets classified into the parameter groups.

6. The processing condition setting apparatus according to claim 2, wherein the controller selects one parameter group that has the largest number of parameter sets classified into the parameter groups.

7. The processing condition setting apparatus according to claim 3, wherein the controller selects one parameter group that has the largest number of parameter sets classified into the parameter groups.

8. The processing condition setting apparatus according to claim 1, wherein the controller selects one parameter group that has the largest number of parameter sets classified into the parameter groups.

9. The processing condition setting apparatus according to claim 1, wherein the controller selects one parameter group based on statistics of the indicators of the post-processing characteristics estimated for the parameter sets classified into the parameter groups.

10. The processing condition setting apparatus according to claim 9, wherein the controller;

sets a priority for each of the two or more indicators; and selects a parameter group for which the average value of the indicators with the high priority of the post-processing characteristics is closest to target values of the constraints.

11. A wafer production system, comprising the processing condition setting apparatus of claim 1, and the wafer processing apparatus.

12. A processing condition setting apparatus comprising a controller that selects a parameter set to be applied to a wafer processing apparatus from a plurality of parameter sets, each of the parameter sets includes a combination of setting values set for each of a plurality of setting items that specify processing operation of the wafer processing apparatus, each of the setting items is applied in one processing step performed by the wafer processing apparatus, the controller, before the wafer processing apparatus processes a wafer to be processed:

obtains changes in wafer characteristics before and after processing when a wafer is processed by applying each of the parameter sets, as processing data for each of the parameter sets;

obtains pre-processing characteristics of the wafer to be processed;

estimates, for each of the parameter sets, post-processing characteristics of the wafer to be processed, based on the pre-processing characteristics of the wafer to be processed and the processing data, assuming that the wafer to be processed has been processed by applying each of the parameter sets, and calculates two or more indicators for each of the post-processing characteristics;

obtains constraints on the indicators; and selects a parameter set, which is to be applied to the wafer processing apparatus when processing the wafer to be processed, from among conformed parameter sets in which the indicators satisfy the constraints, wherein the controller acquires, as the processing data, the changes in wafer characteristics before and after processing assuming the setting values of each of two or more of the setting items in one or more of the processing steps, or the changes in wafer characteristics before and after processing assuming the setting values of each of one or more of the setting items in two or more of the processing steps.

13. A processing condition setting method for selecting a parameter set to be applied to a wafer processing apparatus from among a plurality of parameter sets, wherein each of the parameter sets includes a combination of setting values set for each of a plurality of setting items that specify processing operation of the wafer processing apparatus, each of the setting items is applied in one processing step performed by the wafer processing apparatus, the processing condition setting method includes:

obtaining changes in wafer characteristics before and after processing when a wafer is processed by applying each of the parameter sets, as the processing data for each of the parameter sets, before the wafer processing apparatus processes a wafer to be processed;

obtaining pre-processing characteristics of the wafer to be processed;

estimating, for each of the parameter sets, post-processing characteristics of the wafer to be processed, based on the pre-processing characteristics of the wafer to be processed and the processing data, assuming that the wafer to be processed has been processed by applying each of the parameter sets, and calculating two or more indicators for each of the post-processing characteristics;

obtaining constraints on the indicators; and selecting a parameter set, which is to be applied to the wafer processing apparatus when processing the wafer to be processed, from among conformed parameter sets in which the indicators satisfy the constraints, wherein the processing condition setting method further includes:

classifying the conformed parameter sets into parameter groups;

selecting one parameter group from the parameter groups as a selected group;

selecting a parameter set, which is to be applied when processing the wafer to be processed, from the conformed parameter sets classified in the selected group, as a processing parameter set;

mapping each of the parameter sets to a grid point defined in a multidimensional vector space with each of the setting items as a basis;

classifying grid points that correspond to the conformed parameter sets and are adjacent to each other in the multidimensional vector space into the same grid point group; and classifying the parameter sets that correspond to the grid points classified in the grid point group into the same parameter group.

\* \* \* \* \*